US011037802B2

(12) United States Patent
May et al.

(10) Patent No.: US 11,037,802 B2
(45) Date of Patent: Jun. 15, 2021

(54) PACKAGE SUBSTRATE HAVING COPPER ALLOY SPUTTER SEED LAYER AND HIGH DENSITY INTERCONNECTS

(71) Applicant: Intel Corporation, Santa Clara, CA (US)

(72) Inventors: Robert Alan May, Chandler, AZ (US); Kristof Kuwawi Darmawikarta, Chandler, AZ (US); Sri Ranga Sai Boyapati, Chandler, AZ (US); Sandeep Gaan, Phoenix, AZ (US); Srinivas V. Pietambaram, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 133 days.

(21) Appl. No.: 16/347,207

(22) PCT Filed: Dec. 28, 2016

(86) PCT No.: PCT/US2016/068773
§ 371 (c)(1),
(2) Date: May 3, 2019

(87) PCT Pub. No.: WO2018/125066
PCT Pub. Date: Jul. 5, 2018

(65) Prior Publication Data
US 2019/0259631 A1 Aug. 22, 2019

(51) Int. Cl.
*H01L 23/52* (2006.01)
*H01L 21/48* (2006.01)
(Continued)

(52) U.S. Cl.
CPC ........ *H01L 21/4857* (2013.01); *H01L 21/481* (2013.01); *H01L 23/49822* (2013.01);
(Continued)

(58) Field of Classification Search
CPC ....... H01L 2224/73265; H01L 21/4857; H01L 2224/83; H01L 23/49822; H01L 21/486;
(Continued)

(56) References Cited

U.S. PATENT DOCUMENTS

| 5,139,974 A | 8/1992 | Sandhu et al. |
| 8,450,856 B2 * | 5/2013 | Kang ................ H01L 21/76898 257/774 |

(Continued)

FOREIGN PATENT DOCUMENTS

| JP | 2010519410 A | 6/2010 |
| WO | 2015171288 A1 | 11/2015 |
| WO | 2018125066 A1 | 7/2018 |

OTHER PUBLICATIONS

International Search Report and Written Opinion issued in PCT Application No. PCT/US2016/068773 dated Sep. 28, 2017; 12 pages.

*Primary Examiner* — Luan C Thai
(74) *Attorney, Agent, or Firm* — Patent Capital Group

(57) ABSTRACT

Integrated circuit (IC) package substrates having high density interconnects with a sputter seed layer containing a copper alloy, as well as related structures, devices, and methods, are disclosed herein. For example, in some embodiments, a package substrate may include a first dielectric layer, a sputter seed layer disposed on the first dielectric layer, wherein the seed layer includes a copper alloy, a patterned conductive layer disposed on the seed layer, and a second dielectric layer over the patterned conductive layer.

20 Claims, 13 Drawing Sheets

(51) Int. Cl.
*H01L 23/498* (2006.01)
*H05K 3/42* (2006.01)
*H05K 3/38* (2006.01)

(52) U.S. Cl.
CPC ....... *H01L 23/49866* (2013.01); *H05K 3/423* (2013.01); *H01L 2224/16225* (2013.01); *H01L 2924/15311* (2013.01); *H05K 3/38* (2013.01); *H05K 2201/096* (2013.01); *H05K 2201/09845* (2013.01); *H05K 2203/1407* (2013.01); *H05K 2203/1476* (2013.01)

(58) Field of Classification Search
CPC . H01L 24/24; H01L 23/481; H01L 21/76877; H01L 2224/02331; H01L 21/481; H01L 23/49866; H05K 3/423
USPC .................................. 257/758, 690; 438/622
See application file for complete search history.

(56) References Cited

U.S. PATENT DOCUMENTS

| | | | |
|---|---|---|---|
| 2003/0077871 A1* | 4/2003 | Cheng | H01L 24/19 438/381 |
| 2007/0082501 A1 | 4/2007 | Hurwitz et al. | |
| 2012/0193785 A1* | 8/2012 | Lin | H01L 24/97 257/737 |
| 2013/0207260 A1* | 8/2013 | Hsu | H01L 24/05 257/738 |
| 2014/0124919 A1* | 5/2014 | Huang | H01L 24/97 257/737 |
| 2015/0061143 A1* | 3/2015 | Kim | H01L 23/528 257/773 |
| 2016/0049330 A1* | 2/2016 | Peng | H01L 21/823475 257/774 |
| 2016/0181450 A1 | 6/2016 | Cudzinovic et al. | |

\* cited by examiner

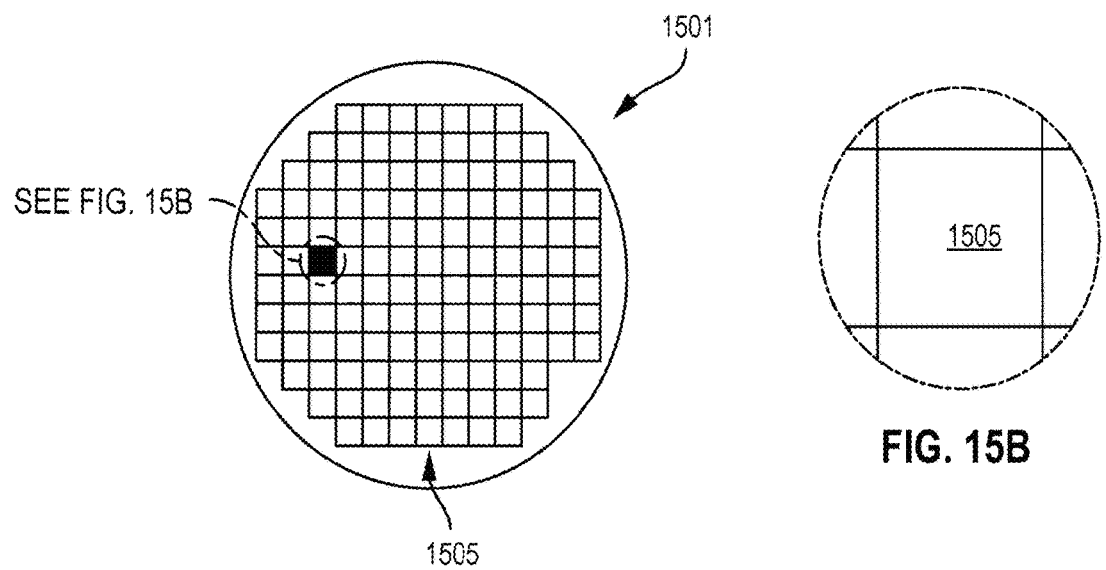
FIG. 15A
FIG. 15B
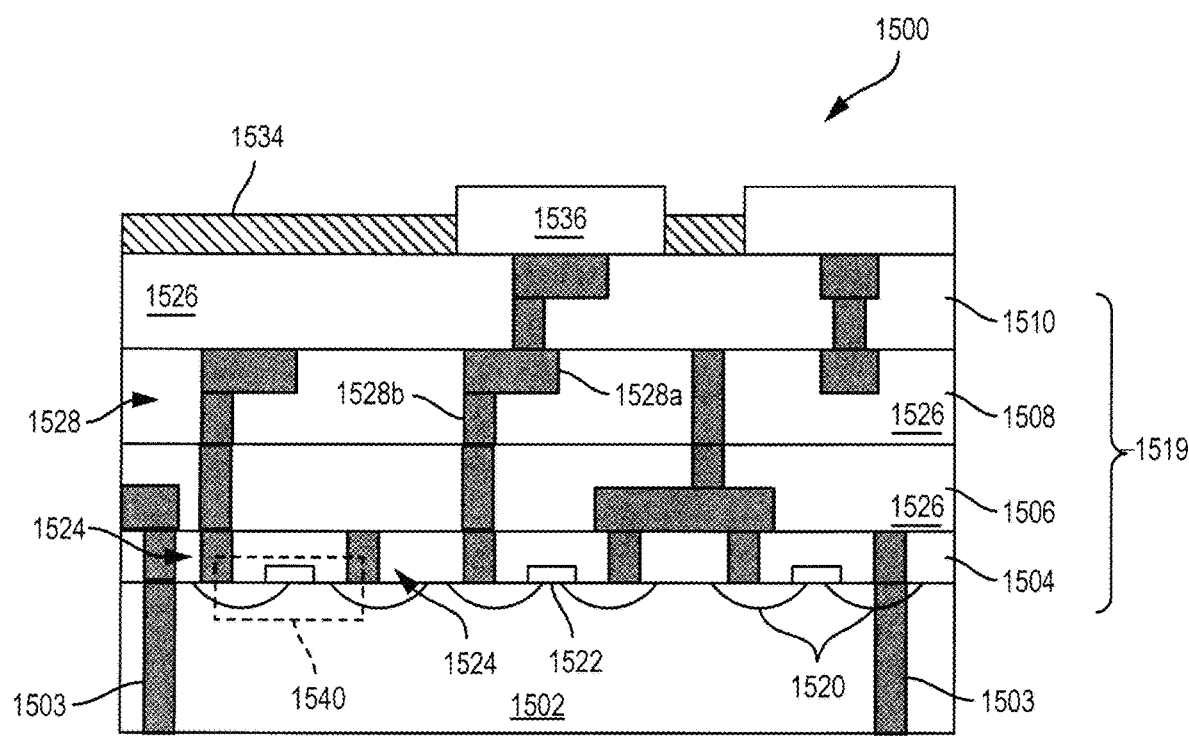
FIG. 15C

PACKAGE SUBSTRATE HAVING COPPER ALLOY SPUTTER SEED LAYER AND HIGH DENSITY INTERCONNECTS

CROSS-REFERENCE TO RELATED APPLICATION

This application is a national stage application under 35 U.S.C. § 371 of PCT International Application Serial No. PCT/US2016/068773 filed on Dec. 28, 2016 and entitled "PACKAGE SUBSTRATE HAVING COPPER ALLOY SPUTTER SEED LAYER AND HIGH DENSITY INTERCONNECTS," which is hereby incorporated by reference in its entirety.

FIELD

Embodiments relate to manufacturing of semiconductor devices. More particularly, the embodiments relate to a package substrate having high density interconnects with a sputter seed layer containing a copper alloy.

BACKGROUND

Semiconductor dies are routinely connected to larger circuit boards such as motherboards and other types of printed circuit boards (PCBs) via a package substrate. A package substrate typically has two sets of connection points, a first set for connection to the die or multiple dies and a second less densely-packed set for connection to the PCB. A package substrate generally consists of an alternating sequence of a plurality of organic insulation or dielectric layers and a plurality of patterned electrically conductive layers forming traces between the insulation layers. Electrically conductive vias, which extend through the insulation layers, electrically interconnect the conductive layers. Continued advancements in integrated circuit technology have resulted in the need for package substrates having higher electrical performance, higher routing density and greater heat spreading capability.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIGS. 15A and 15B are top views of a wafer and dies that may be used with any of the embodiments of the IC structures disclosed herein.

FIG. 15C is a cross-sectional side view of an IC device that may be used with any of the embodiments of the IC structures disclosed herein.

DETAILED DESCRIPTION

Figure 1:
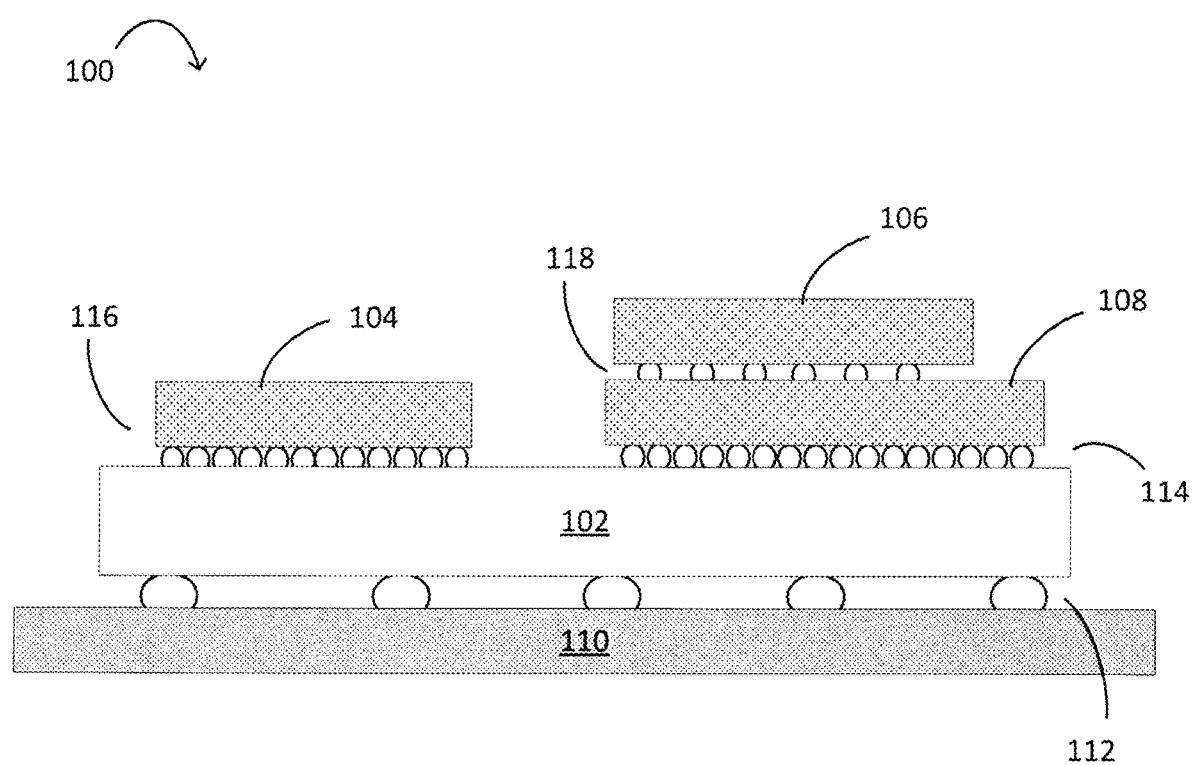
FIG. 1 is a cross-sectional view of an integrated circuit assembly having an integrated circuit package substrate that includes one or more dies, in accordance with various embodiments.

Multi-chip substrates with high density interconnects, as well as related structures, devices, and methods, are generally presented. More specifically, integrated circuit package substrates with high density interconnects having a sputter seed layer that includes a copper alloy are presented. In this regard, embodiments of the present invention enable high density interconnects with an interconnect density of greater than about 100 IO per mm.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

Package substrates for multi-chip packaging (MCP) require significantly high density input/output (IO) routing. The IO density of a substrate may be physically constrained by other elements within the substrate, including via size, line/space pitch (L/S), bump pitch, via-to-pad alignment, pad-to-via alignment, and material (e.g. resist and thin dielectric material) properties. For example, using a known process to achieve a 110 um bump pitch results in a density of less than 20 IO/mm/layer where vias have a diameter of 49 um, a 9/12 um L/S, and 14 um alignment. As used herein, bump pitch refers to the distance between bumps (i.e., bump-to-bump distance from center point to center point). As used herein, "line space", "line space pitch", and "L/S" are used interchangeably and refer to the distance in microns between a die, typically a silicon die, with plates and the substrate connections and is measured by the width of the conductive trace plus the space between the conductive trace and the next conductive trace.

As described herein, very high density interconnects or routing may be a single layer or multiple layers where the conductive traces in multiple layers are connected by vias. As used herein, "very high density routing" refers to an input and output (IO) density associated with a substrate layer, where the IO density is defined as IO per millimeters per layer (IO/mm/Layer). Further, as used herein, a VHD routing refers to an IO density that is greater than 100 IO density (i.e., 100 IO/mm/layer).

Very high density routing requires precision in patterning, alignment and via formation capabilities to create thinner layers and narrower traces. Thinner layers and narrower traces create other challenges, such as, the potential for increased delamination of layers, increased copper loss during seed layer etching and copper roughening, and increased shorting due to layer-to-layer (LtL) electromigration.

A sputtered copper alloy seed layer may resolve these challenges associated with very high density routing by acting as an electromigration barrier, and enabling thinner seed layer deposition while providing strong adhesion to the dielectric and photoresist layers. Further, for enhanced electrical performance, the dielectric layer thickness should be approximately the same as the conductive trace width. For example, in a 2/2 line space, where the trace width is 2 um, an optimal dielectric thickness would be 2 um, which is significantly thinner than the 20-30 um thickness that is typical in current technology. A sputtered copper alloy seed layer allows for a thinner dielectric layer while providing for strong adhesion.

As is known in the art, the term "interconnect" (also sometimes referred to as a trench, a line, or a trace) is used to describe an electrically conductive line isolated by a layer typically comprising an interlayer low-k dielectric material that is provided within the plane of an IC chip. Such interconnects are typically stacked into several levels with a layer of dielectric in between the metal layers. As is also known in the art, the term "via" is used to describe an electrically conductive element that electrically interconnects two or more metal trenches of different levels. Vias are provided substantially perpendicularly to the plane of an IC chip. A via may interconnect two metal trenches in adjacent levels or two metal trenches in levels that are not adjacent to one another. As is known in the art, the terms lines, trenches, and vias are commonly associated with the features that are used to form metal interconnects. As used herein, the terms "line", "trace", "interconnect", and "trench" may be used interchangeably.

To form electrical interconnects, dielectric layers may be patterned to create one or more trench or via openings that may be filled with metal to form interconnects. In general, a feature used to form a metal interconnect is a depression having any shape formed in a substrate or layer deposited on the substrate. The feature is filled with conducting material. The trenches or vias may be created using conventional wet or dry etch semiconductor processing techniques. Dielectric materials may be used to isolate electrically metal interconnects from the surrounding components.

FIG. 1 is a cross-sectional view of an integrated circuit assembly 100 having an integrated circuit package substrate 102 that includes one or more dies 104, 106, 108, in accordance with various embodiments. Multiple dies 104, 108 may be coupled to a package substrate 102 via first-level interconnects (FLI) 114, 116. Dies 106, 108 may be stacked and electrically coupled to the package substrate 102 via another die. The package substrate 102 may include electrical pathways (not shown) to route signals or power between the FLI 114, 116 and the second-level interconnects (SLI) 112, as known in the art. These electrical or conductive pathways may be high density or very high density interconnects as described herein. In some embodiments, the area 114, 116 between the die 104, 108 and the package substrate 102, and the area 118 between die 108 and die 106 may be filled with underfill (not shown). The package substrate 102 may be coupled to a circuit board 110 via SLI 112.

Figure 2A:
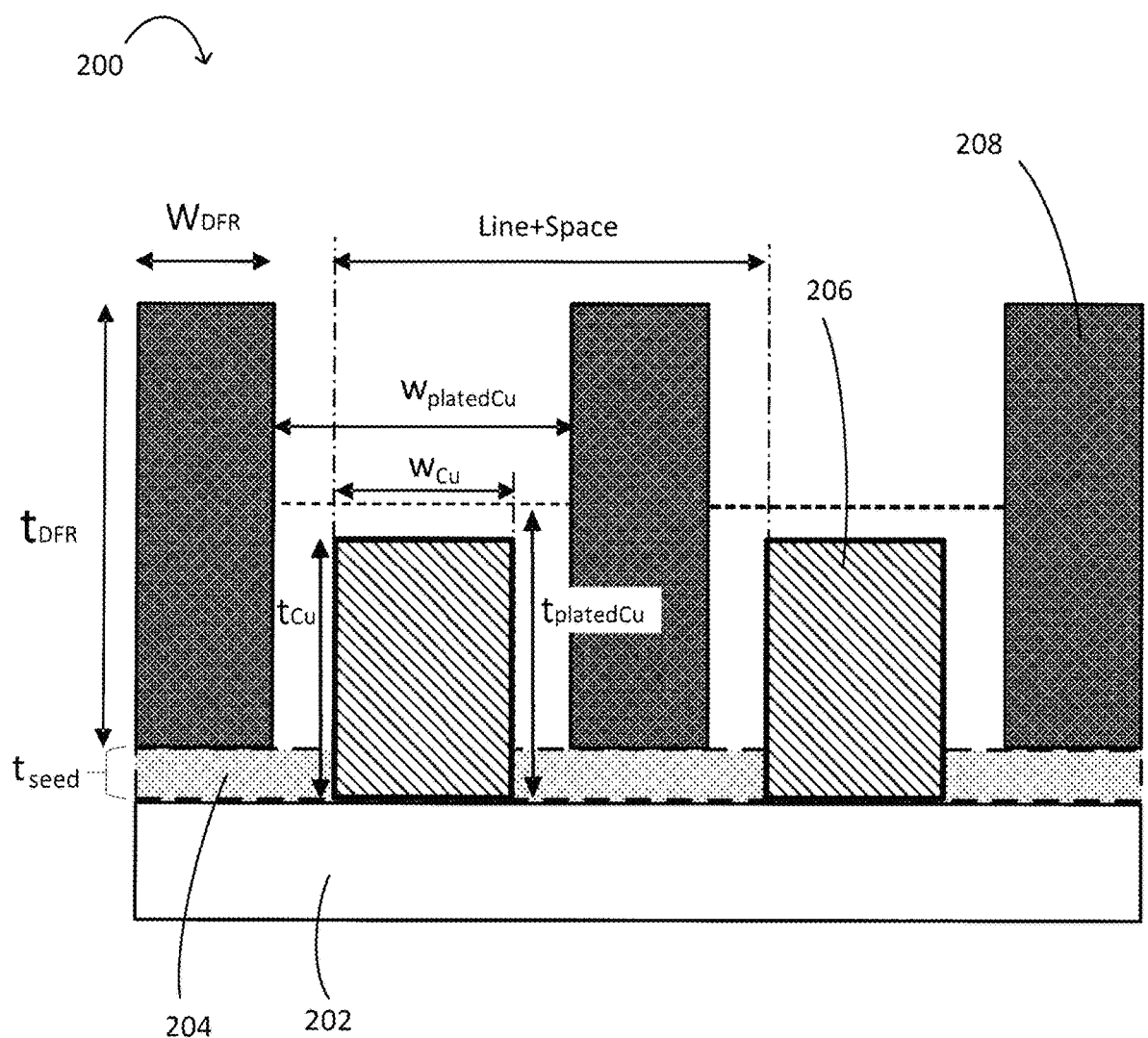
FIG. 2A is a cross-sectional illustration of a package substrate having high density interconnect layers showing the initial conductive trace width as compared to the final conductive trace width, in accordance with various embodiments.

FIG. 2A is a cross-sectional illustration of a package substrate having high density interconnect layers with a seed layer showing the initial conductive trace width as compared to the final conductive trace width, in accordance with various embodiments. As shown, the package substrate 200 may include a dielectric layer 202, a seed layer 204, copper traces 206, and photoresist 208. FIG. 2 depicts a selected portion of a package substrate 200 during a fabrication process to illustrate how the seed layer thickness (tseed) may affect the final copper trace width (WCu) and final copper trace thickness (tCu) due to seed layer etching. To compensate for the loss of the plated copper trace width (WplatedCu) and thickness (tplatedCu) during the seed layer etching, the plated copper trace width must be wider than the target or final copper trace width. Typically, the plated copper trace width must be approximately twice the seed layer thickness. With the smaller line space target required in very high density routing, the resist width to resist thickness (WDFR to tDFR) aspect ratio becomes larger, and may require a more mechanically robust resist that withstands plating processes and maintains adhesion to the seed layer without delaminating.

A standard electroless copper seed layer is typically about 1 um thick, and requires dielectric roughening for mechanical adhesion, and, as such, has a high etch bias. A standard sputter seed layer may be thinner, but uses an adhesion layer, such as a titanium thin film, to maintain good adhesion. However, titanium is costly and difficult to remove, and titanium etching solutions are volatile and have a short bath-life.

A sputter copper alloy seed layer allows for a thinner seed layer that has high adhesion to the underlying dielectric layer and to the overlying resist layer even without an additional adhesion layer. The copper alloy may be formulated to provide good adhesion to the dielectric layer by chemical adhesion and/or by mechanical anchoring (e.g., a roughened surface). A copper alloy containing nickel, aluminum, tungsten, cobalt, manganese, or ruthenium, or a combination of these elements enables chemical adhesion through oxygen bonding and/or ionic bonding between the dielectric and the seed layer, which eliminates the need for dielectric roughening (e.g. by a desmear process). Further, tungsten, cobalt, manganese, and ruthenium may act as barriers to electromigration, so alloying of tungsten, cobalt, manganese, or ruthenium, or a combination of these elements in sputtered copper seed layer may improve electromigration resistance in silicon back end of line processes. Composition of the copper alloy may be formulated to achieve the desired properties such as electrical resistance, adhesion as well as electromigration resistance. Typically, the alloying material varies from a few percentage to about 50% of copper, the principal alloy component.

A sputter copper alloy seed layer may comprise a copper alloy, a copper/copper alloy, or a copper alloy/copper alloy, where the alloy may be the same alloy having different material content percentages, or may be a different alloy with the same or different material content percentages. A sputter copper alloy seed layer may be as thin as 0.5 um, 0.25 um, or 0.1 um; preferably, the thickness is about 0.1 to 0.2 um. A sputter copper alloy layer may be one layer or may be multiple layers. The sputter copper alloy seed layer may be formulated such that the copper alloy seed layer may be etched with the same etchant chemistry as a copper seed layer.

At 2/2 um line space, there may be an increased likelihood for the photoresist layer to delaminate from the seed layer, which is smoother due to the unroughened dielectric layer. In some embodiments, to reduce the likelihood of delamination, the seed layer may be roughened, for example, by a post-sputtering chemical roughening process, a post-sputtering ion bombardment process, or by adjusting sputtering parameters during the sputtering process, among others. During the sputtering process, film microstructure and surface morphology result from an interplay between shadowing, adatom diffusion, and surface/volume recrystallization and grain growth. Thus, in some embodiments, surface roughening may be engineered in-situ by adjusting sputtering parameters. Sputtered seed deposition is typically performed in a single step that favors dense, smooth film, following the Zone T (low Argon pressure, and low/medium substrate temperature) of the Thornton diagram. This type of deposition results in a dense and smooth film that affords high electrical conductivity and adhesion to the underlying dielectric layer. To increase surface roughness, a two-step sputtering process may be performed, where the second step increases columnar growth on the surface of the seed layer by increasing the Argon pressure and by lowering the substrate temperature. These conditions limit adatom mobility and lead to preferential grain growth towards the incoming coating flux direction. The sputter chamber deposition pressure may be varied from about a few mTorr to several hundred mTorr depending on the chamber design and configuration to optimize columnar growth. Substrate temperature may be adjusted from about −50 C to 200 C.

Figure 2B:
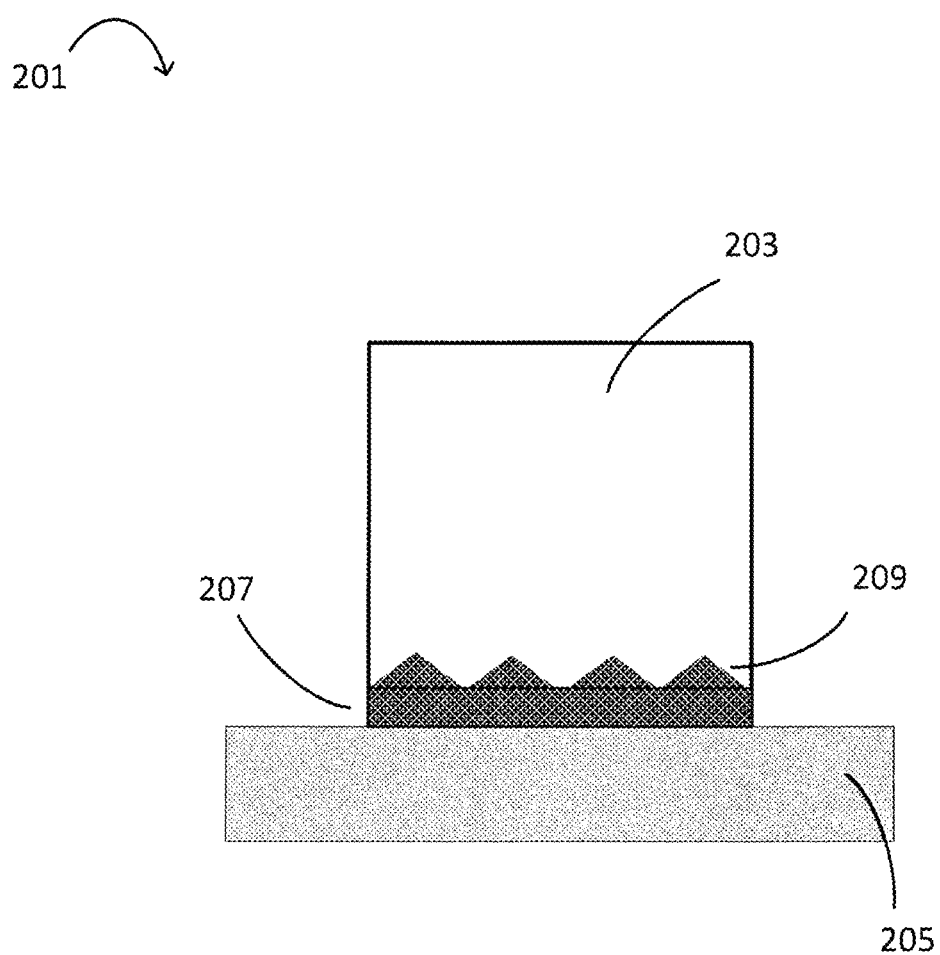
FIG. 2B is a cross-sectional illustration of a roughened sputter seed layer that includes a copper alloy, in accordance with various embodiments.

FIG. 2B is a cross-sectional illustration of a sputter copper alloy seed layer roughened during the sputtering process, in accordance with various embodiments. FIG. 2B depicts a cross-section view of a roughened sputter seed layer after the two-step sputtering process described above. The schematic 201 includes a dielectric layer 205, a sputter copper alloy seed layer deposited during a first sputtering step 207, a roughened surface of the sputter copper alloy seed layer created during a second sputtering step 209, and a photoresist layer 203. FIG. 2B depicts the columnar growth microstructure on the surface of the seed layer as a result of the two-step sputtering process. This increased surface roughness provides a mechanical anchor for the overlying photoresist and conductive layers.

In some embodiments, surface roughening may be performed post-sputtering deposition in via plasma etching or energetic ion bombardment of the film surface in the sputter chamber by controlling the power, Argon pressure and/or surface distance from the electrode.

FIGS. 3-13 are cross-sectional views of an example process in various stages of forming high density interconnect layers in a package substrate with a sputter seed layer containing a copper alloy, in accordance with various embodiments.

Figure 3:
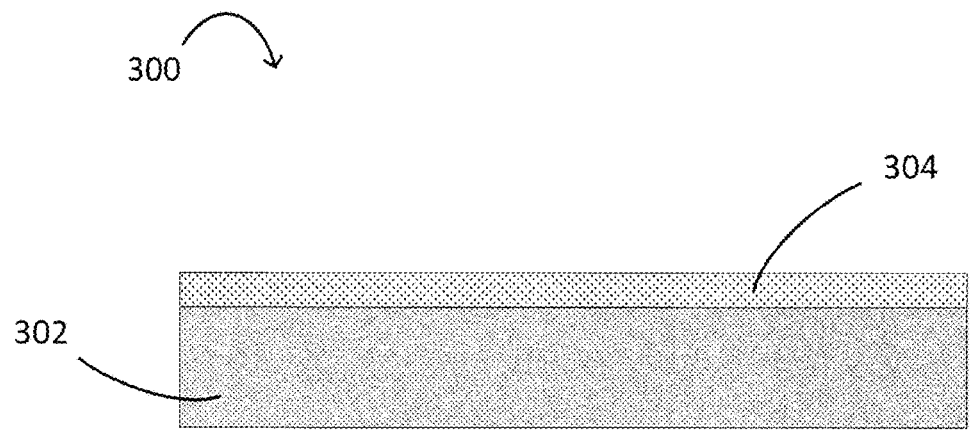
FIGS. 3-13 are cross-sectional views of an example process of forming high density interconnect layers in a package substrate with a sputter seed layer containing a copper alloy, in accordance with various embodiments.

FIG. 3 illustrates seed layer 304 deposited on dielectric layer 302 to create assembly 300. Seed layer 304 is a copper alloy, copper/copper alloy, or copper alloy/copper alloy seed layer that is sputtered. The alloy is preferably manganese, cobalt, tungsten, or ruthenium, or a combination of these elements.

The one or more dielectric layers may be formed using dielectric materials known for their applicability in integrated circuit structures, such as low-k dielectric materials. The dielectric layer may be deposited by any suitable process, including, for example, chemical vapor deposition (CVD), or spin on process, among others. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass (OSG). Typically, low-k films have a dielectric constant smaller than that of SiO2, which has a dielectric constant of about 4.0. Low-k films having dielectric constants of about 2.7 to about 3 are typical in current semiconductor fabrication processes. The dielectric layers may include pores or air gaps to further reduce their dielectric constant.

In some embodiments, the dielectric layer may be formed on a semiconductor substrate. In some embodiments, the semiconductor substrate may be a crystalline substrate formed using a bulk silicon or a silicon-on-insulator substructure. In some embodiments, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In some embodiments, the dielectric and conductive layers may be formed on a temporary carrier in a coreless process. Although a few examples of materials from which the substrate may be formed are described here, any material that may serve as a foundation upon which a semiconductor device or semiconductor subcomponent, such as a package substrate, may be built falls within the spirit and scope of the present disclosure.

Figure 4:
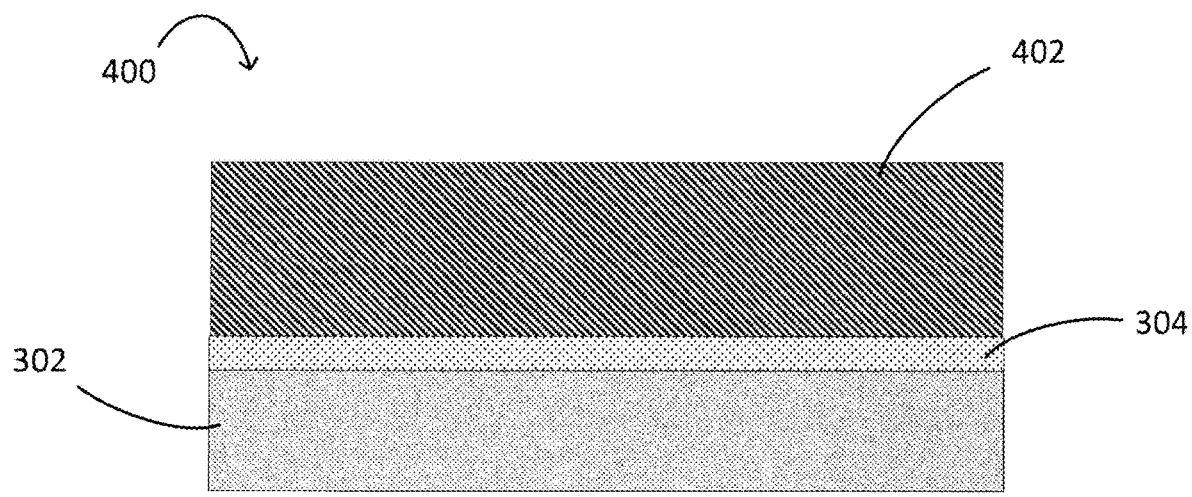

FIG. 4 illustrates assembly 400, which is assembly 300 after depositing photoresist layer 402 over the seed layer 304. Photoresist may be deposited using any suitable process. If conductive interconnects are formed using lithography, photoresist layers may be deposited using any suitable process, such as lamination, and may be positively or negatively charged to create crosslinked and non-crosslinked portions using ultraviolet for patterning conductive material layer. Non-crosslinked portions dissolve to form openings where conductive material may be deposited.

Figure 5:
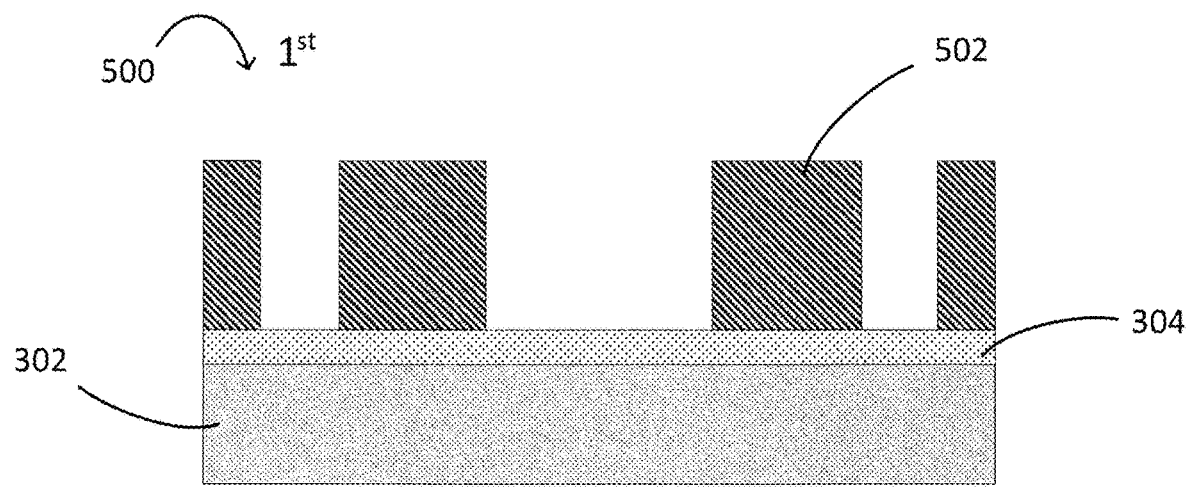

FIG. 5 illustrates assembly 500, which is assembly 400 after patterning of photoresist layer 402. For one embodiment, the patterning of photoresist layer 402 may be implemented with lithographic patterning processes (e.g., exposed with a radiation source through a routing layer mask and developed with a developer) to pattern traces and pads.

Figure 6:
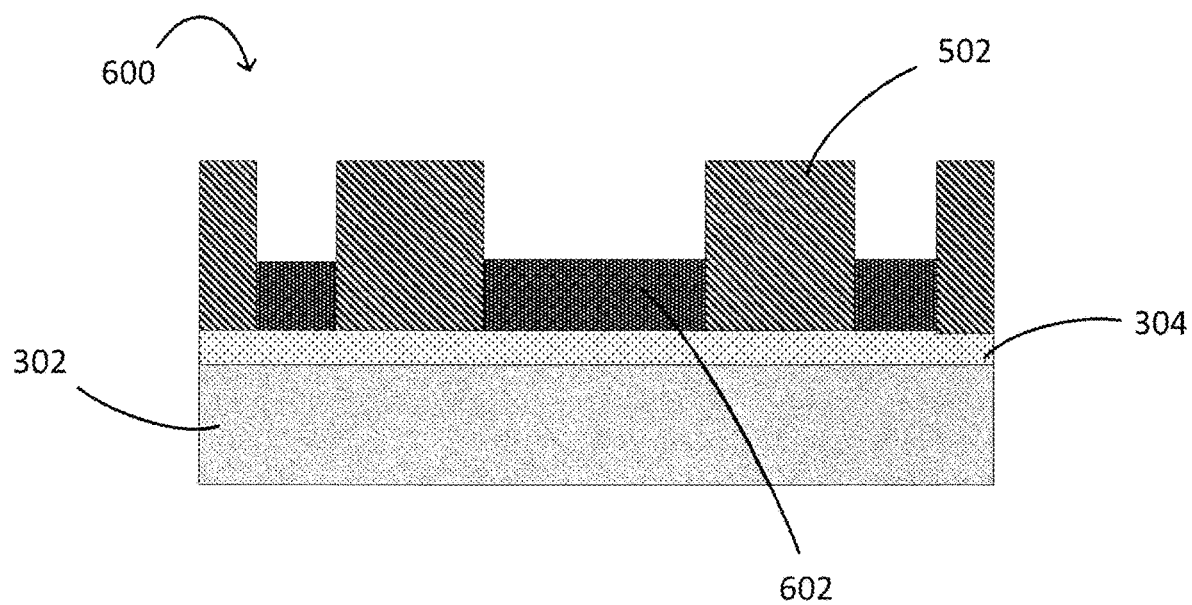

FIG. 6 illustrates assembly 600, which is assembly 500 after conductive material layer 602 is deposited. Conductive material layer 602 may be any type of conductive metal, preferably, copper. As illustrated, conductive material 602 is deposited into openings formed by the patterned photoresist layer 502 to form conductive traces and pads. In some embodiments, conductive material 602 is formed using an elytic copper plating. In some embodiments, conductive lines and pads may be formed with a copper electroplating process, sputtered copper, or the like.

Figure 7:
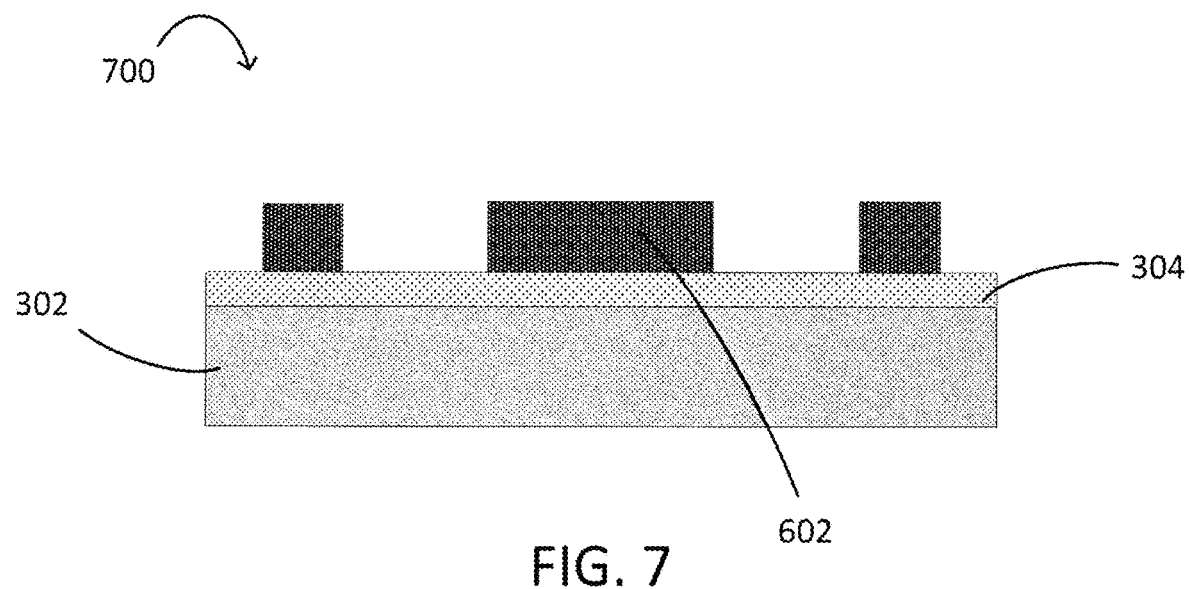

FIG. 7 illustrates assembly 700, which is assembly 600 after photoresist layer 502 is removed.

Figure 8:
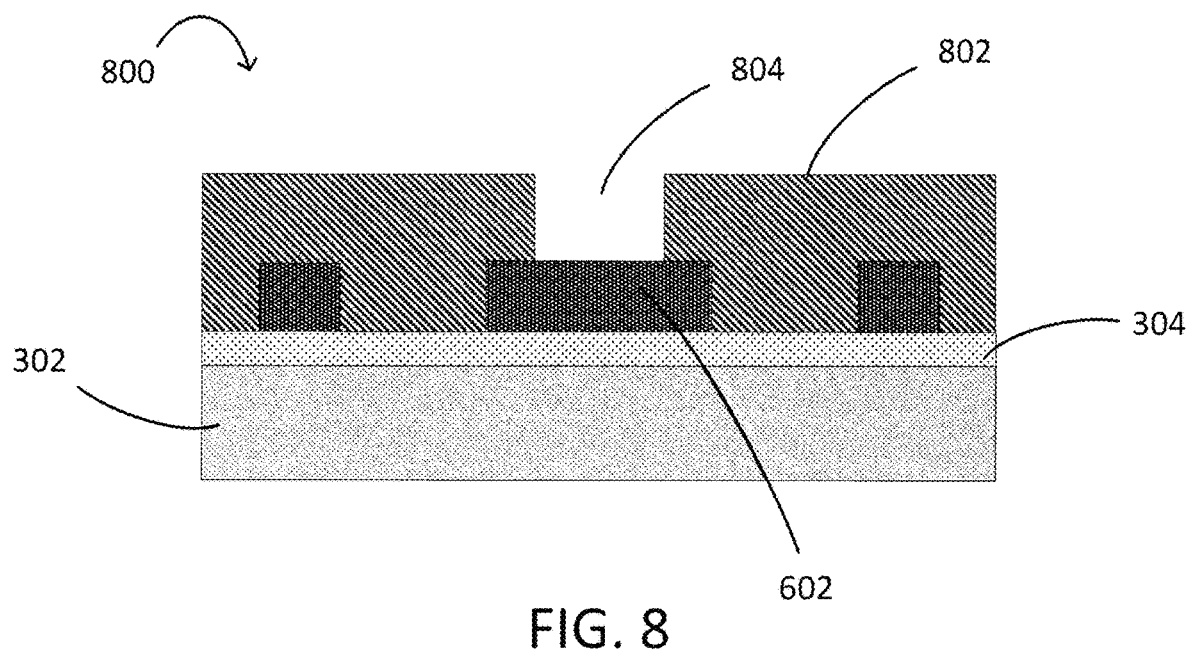

FIG. 8 illustrates assembly 800, which is assembly 700 after second photoresist layer 802 is deposited and patterned to form conductive via opening 804. Second photoresist layer 802 is deposited to protect previously electroplated pads and traces that will be connected by conductive vias. Second photoresist layer 802 made be deposited using any suitable process, for example, a lithography patterning process. In some embodiments, via opening 804 has substantially vertical sidewalls. In some embodiments, via opening 802 has angled sidewalls to form conical-shaped vias.

Figure 9:
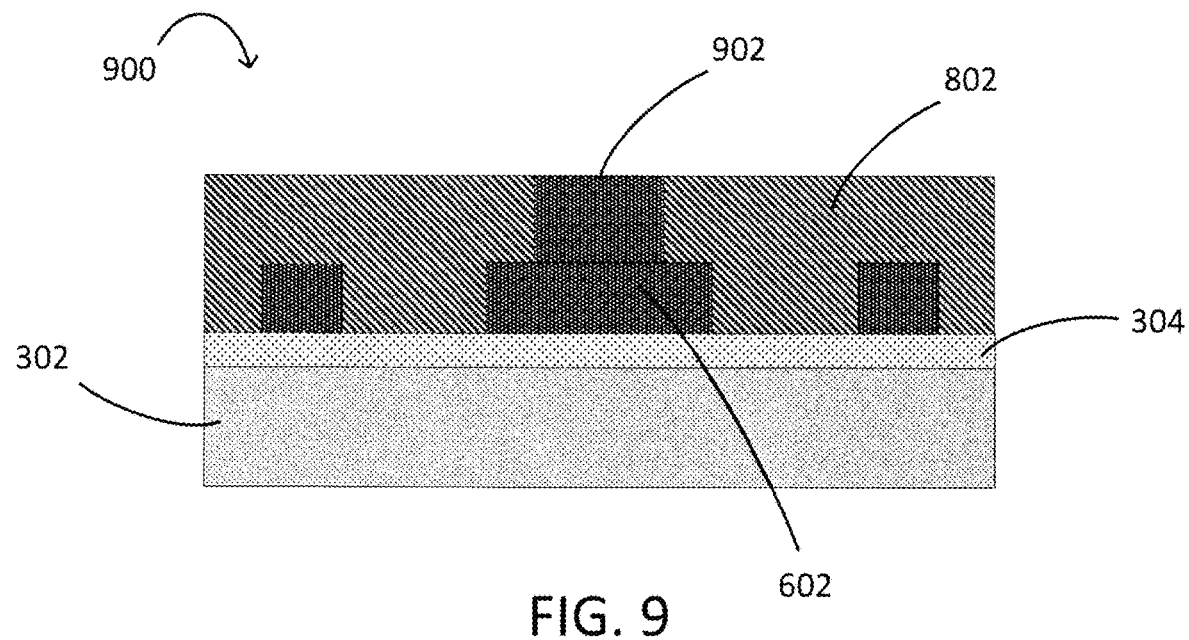

FIG. 9 illustrates assembly 900, which is assembly 800 after conductive material is deposited into via opening 804 to form via 902. Conductive material may be deposited only on the portions of the exposed conductive layer, such as via opening 804. Conductive vias or pillars may be formed from copper and may act as vertical interconnects between adjacent conductive layers. In various embodiments, the via 108 may be filled with same or different materials. For example, the via may include, consist of, or consist essentially of copper (Cu). The via 108 may include, consist of, or consist essentially of one or more bulk materials comprising aluminum (Al), copper (Cu), tungsten (W), cobalt (Co), ruthenium (Ru), nickel (Ni), iron (Fe), and molybdenum (Mo) and/or one or more alloys comprising aluminum (Al), copper (Cu), tungsten (W), cobalt (Co), ruthenium (Ru), manganese (Mn), magnesium (Mg), boron (B), phosphorus (P), nitrogen (N), carbon (C), and sulfur (S).

Figure 10:
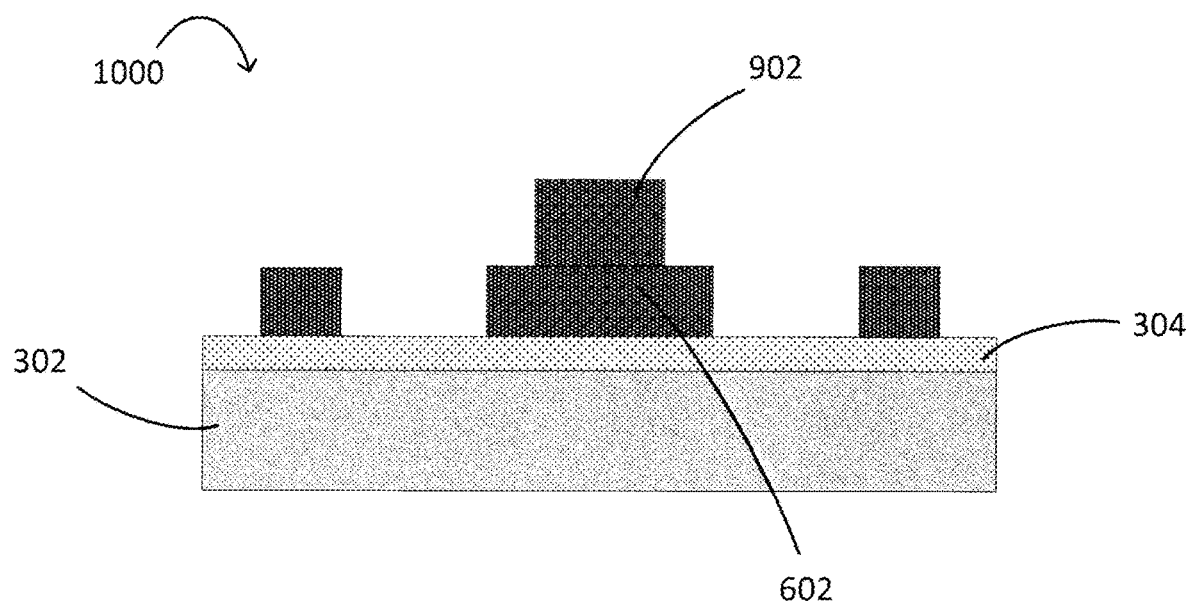

FIG. 10 illustrates assembly 1000, which is assembly 900 after second photoresist layer 802 is removed.

Figure 11:
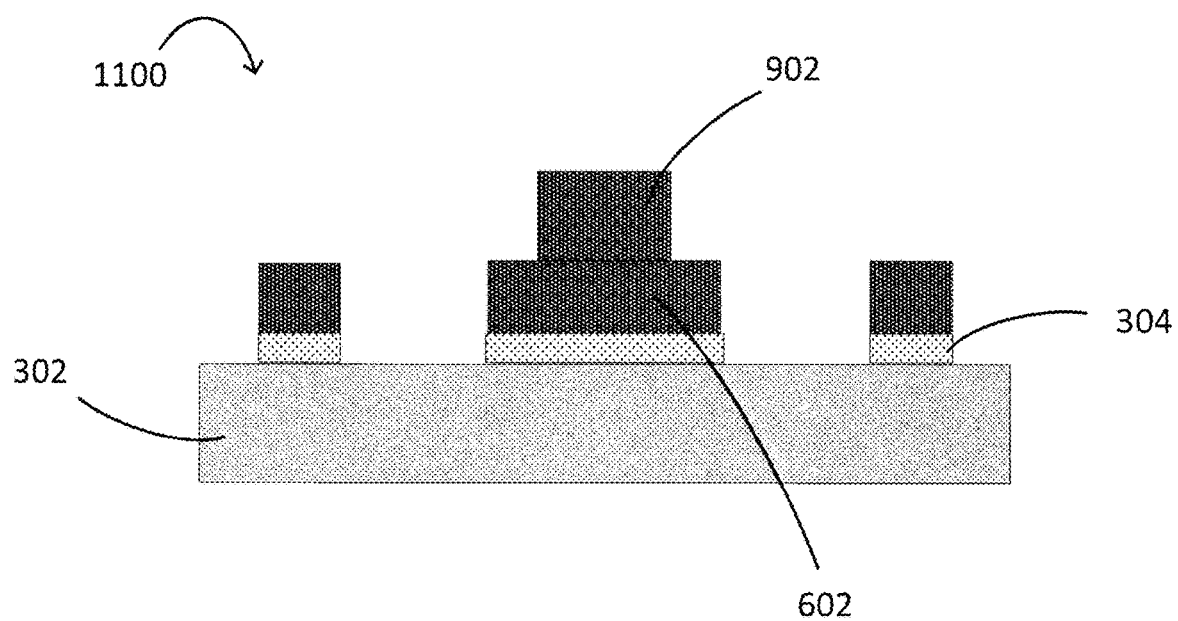

FIG. 11 illustrates assembly 1100, which is assembly 1000 after exposed portions (non-metal layer portions) of seed layer 304 are etched. In some embodiments, portions of exposed seed layer 304 may be etched with a flash etching process, a wet etch process, or a dry etch process.

Figure 12:
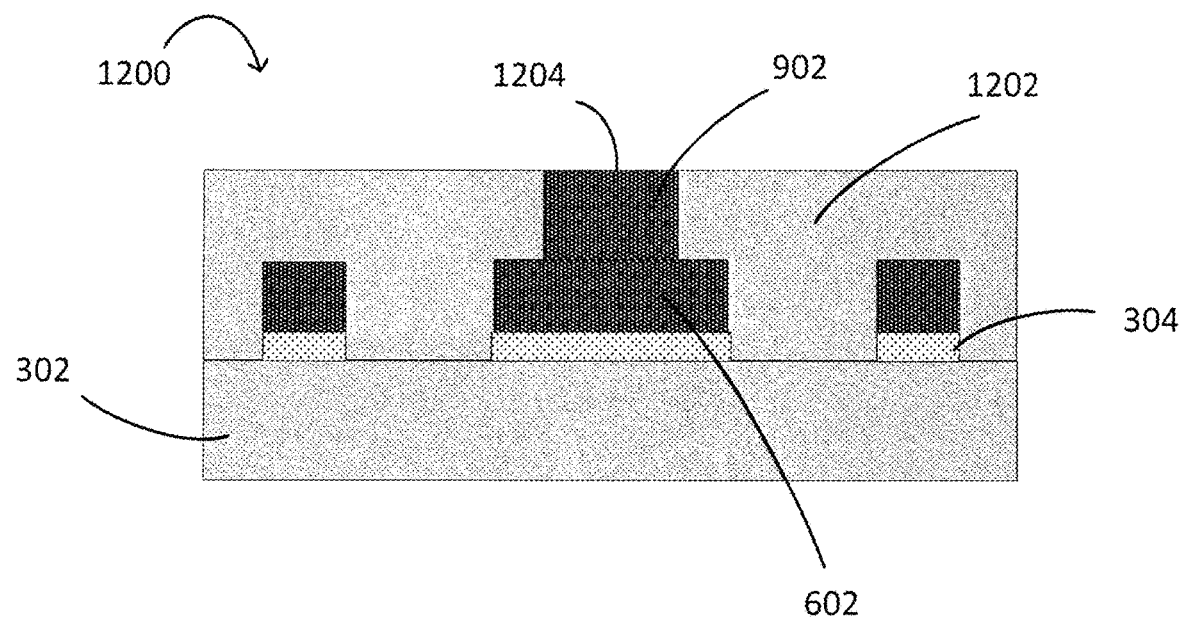

FIG. 12 illustrates assembly 1200, which is assembly 1100 after dielectric layer 1202 is deposited on top of the conductive features, and the top surface of the conductive via 1204 is subsequently revealed by a mechanical, chemical, or plasma etchback.

Figure 13:
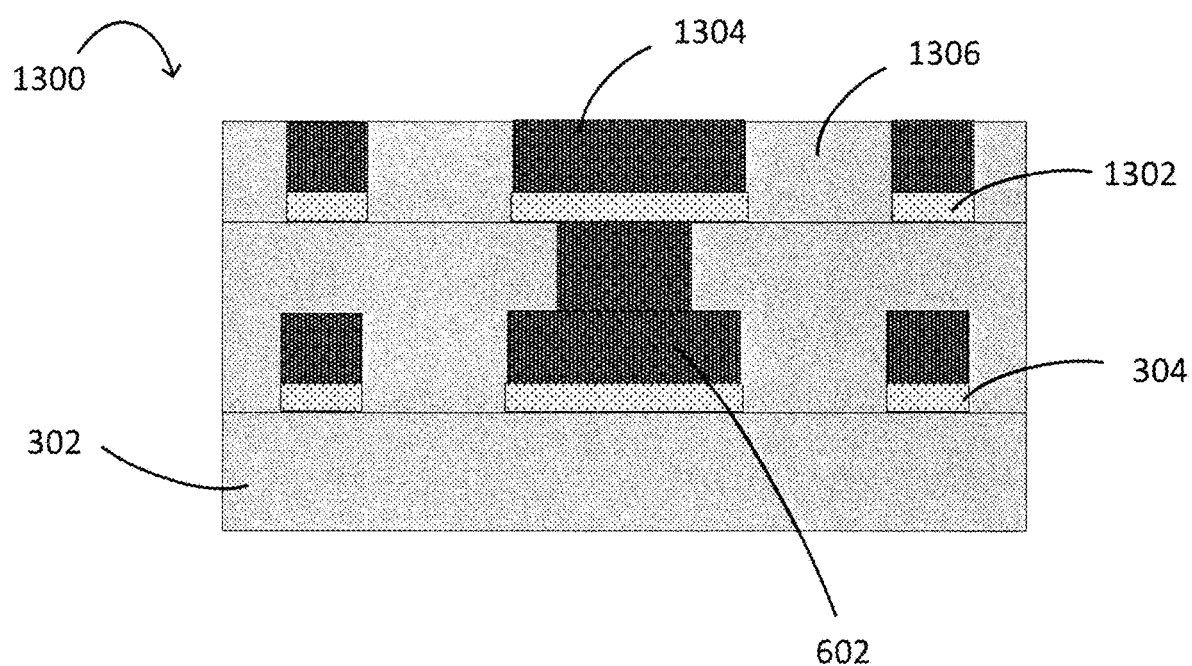

FIG. 13 illustrates assembly 1300, which is assembly 1200 after the process described in FIGS. 4-12 are repeated to add another sputter seed layer 1302, conductive material layer 1304, and dielectric layer 1306. Additional dielectric layers, sputter seed layers, and conductive material layers, including conductive vias, may be added as described in FIGS. 3-12.

Dielectric layers 302, 1202, 1306 may be formed with any suitable process, such as lamination or slit coating and curing, and with any suitable material, such as epoxy with silica. In some embodiments, dielectric layers 1202, 1306 are formed to a thickness that will completely cover a top surface of the one or more vias to account for uneven surfaces. In some embodiments, the thickness of dielectric layers 1202, 1306 may be minimized to reduce the etching time required to expose the one or more vias in a subsequent processing operation. In some embodiments, dielectric layer thickness is approximately the same as conductive trace width.

Photoresist layers may be formed with any suitable process, such as lamination, and may be positively or negatively charged to create crosslinked and non-crosslinked portions using ultraviolet for patterning conductive material layer. Non-crosslinked portions dissolve to form openings where conductive material may be deposited.

Figure 14A:
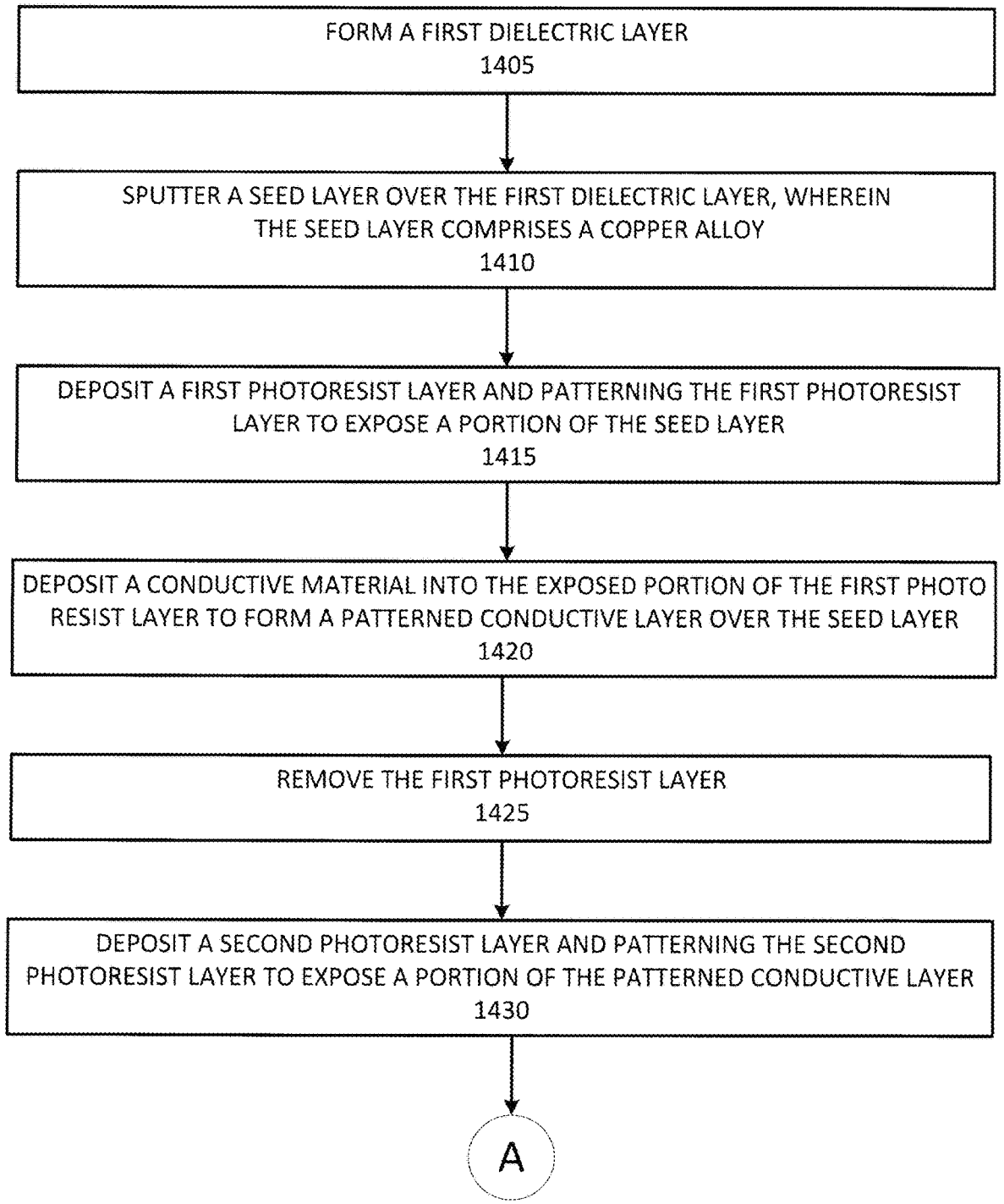
FIGS. 14A and 14B are a process flow diagram of an example method of forming high density interconnect layers in a package substrate with a sputter seed layer containing a copper alloy, in accordance with various embodiments.
Figure 14B:
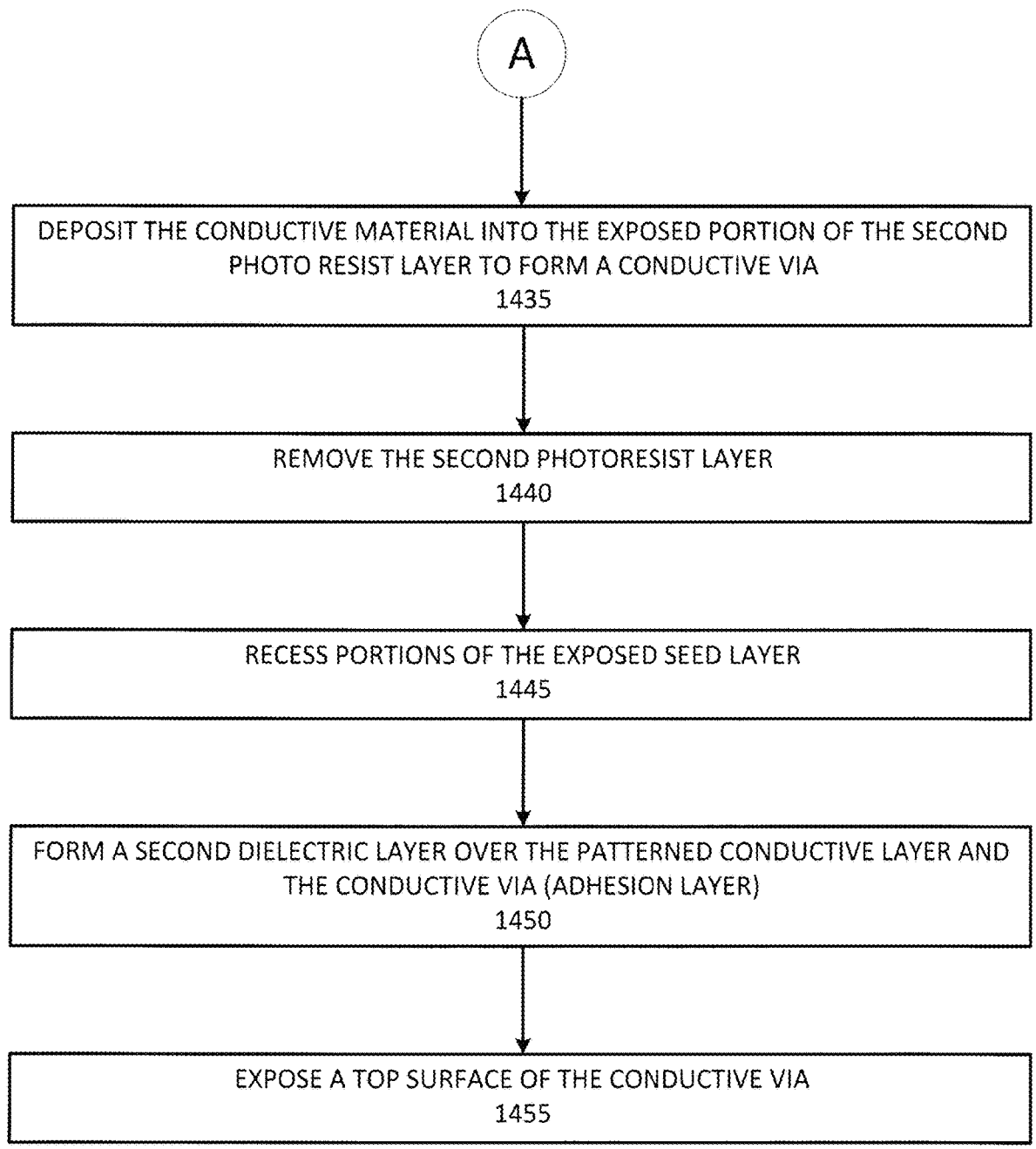

FIGS. 14A and 14B are a process flow diagram of an example method of forming high density interconnect layers in a package substrate with a sputter seed layer containing a copper alloy, in accordance with various embodiments.

At 1405, a first dielectric layer may be formed. At 1410, a seed layer containing a copper alloy, a copper/copper alloy, or a copper alloy/copper alloy may be deposited over the first dielectric layer. As described above, the seed layer may comprise multiple layers. At 1415, a first photoresist layer may be deposited and patterned to expose a portion of the seed layer. At 1420, a conductive material may be deposited on the exposed portion of the first photo resist layer to form a patterned conductive layer over the seed layer. At 1425, the first photoresist layer may be removed.

At 1430, a second photoresist layer may be deposited and patterned to expose a portion of the patterned conductive layer and create an opening for a conductive via. At 1435, conductive material may be deposited into the exposed portion of the second photo resist layer to form a conductive via. At 1440, the second photoresist layer may be removed.

At 1445, portions of the exposed seed layer may be etched. Optionally, an adhesive layer may be deposited to increase adhesion between the conductive layer and the next dielectric layer.

At 1450, a second dielectric layer may be formed over the patterned conductive layer and the conductive via. At 1455, the second dielectric layer may be etched back to expose the top surface of the conductive via.

Additional sputter seed layers and conductive layers may be formed by repeating the process as described in 1410 through 1455.

Figure 16:
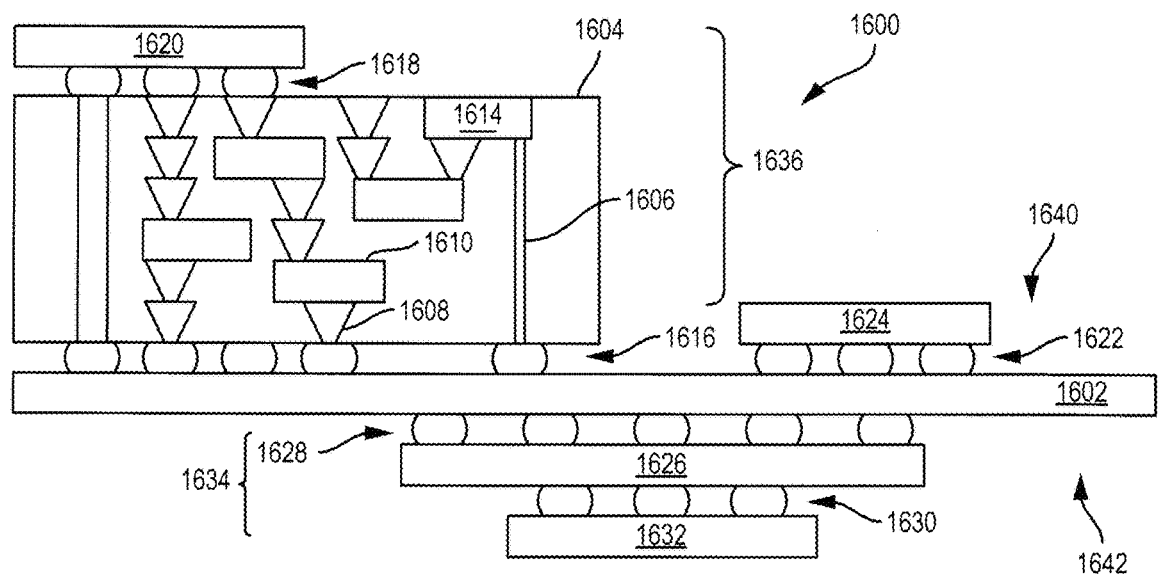
FIG. 16 is a cross-sectional side view of an IC device assembly that may include any of the embodiments of the IC structures disclosed herein.
Figure 17:
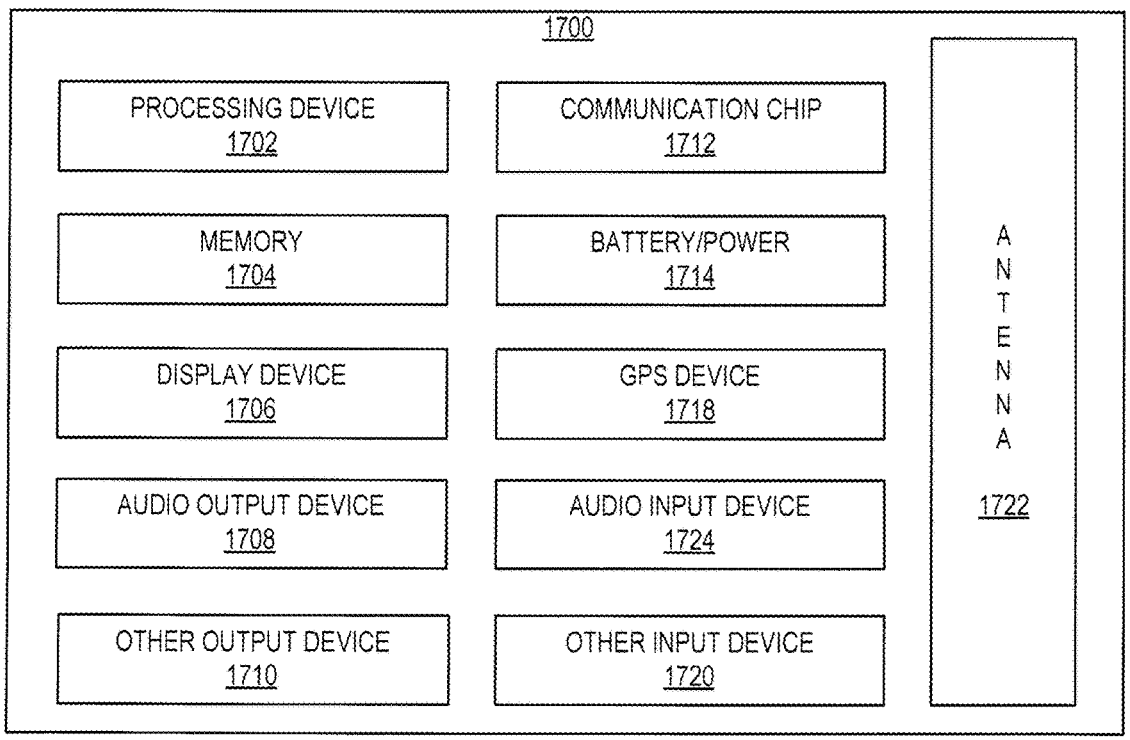
FIG. 17 is a block diagram of an example computing device that may include any of the embodiments of the IC structures disclosed herein.

The package substrates disclosed herein may be included in any suitable electronic device. FIGS. 15-17 illustrate various examples of apparatuses that may be included in, or that may include, one or more of any of the package substrates disclosed herein.

FIGS. 15A-B are top views of a wafer 1501 and dies 1505 that may be included in an IC package along with any of the package substrates disclosed herein. The wafer 1501 may be composed of semiconductor material and may include one or more dies 1505 having IC elements formed on a surface of the wafer 1501. Each of the dies 1505 may be a repeating unit of a semiconductor product that includes any suitable IC. After the fabrication of the semiconductor product is complete, the wafer 1501 may undergo a singulation process in which each of the dies 1505 is separated from one another to provide discrete "chips" of the semiconductor product. The die 1505 may include one or more transistors (e.g., some of the transistors 1540 of FIG. 15C, discussed below) and/or supporting circuitry to route electrical signals to the transistors, as well as any other IC components. In some embodiments, the wafer 1501 or the die 1505 may include a memory device (e.g., a static random access memory (SRAM) device), a logic device (e.g., AND, OR, NAND, or NOR gate), or any other suitable circuit element. Multiple ones of these devices may be combined on a single die 1505. For example, a memory array formed by multiple memory devices may be formed on a same die 1505 as a processing device (e.g., the processing device 1702 of FIG. 17) or other logic that is configured to store information in the memory devices or execute instructions stored in the memory array. In some embodiments, the die 1505 may include circuitry that is to couple to and interact with circuitry provided by integral devices in the package substrate, after the die 1505 is coupled to the package substrate, as discussed above.

FIG. 15C is a cross-sectional side view of an IC device 1500 that may be included in a die that may be coupled to any of the package substrates disclosed herein. In particular, one or more of the IC devices 1500 may be included in one or more dies. The IC device 1500 may be formed on a substrate 1502 (e.g., the wafer 1501 of FIG. 15A) and may be included in a die (e.g., the die 1505 of FIG. 15B). The substrate 1502 may be a semiconductor substrate composed of semiconductor material systems including, for example, N-type or P-type materials systems. The substrate 1502 may include, for example, a crystalline substrate formed using a bulk silicon or a silicon-on-insulator substructure. In some embodiments, the substrate 1502 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1502. Although a few examples of materials from which the substrate 1502 may be formed are described here, any material that may serve as a foundation for an IC device 1500 may be used. The substrate 1502 may be part of a singulated die (e.g., the dies 1505 of FIG. 15B) or a wafer (e.g., the wafer 1501 of FIG. 15A). The substrate 1502 may include conductive pathways 1503.

The IC device 1500 may include one or more device layers 1504 disposed on the substrate 1502. The device layer 1504 may include features of one or more transistors 1540 (e.g., metal oxide semiconductor field-effect transistors (MOSFETs)) formed on the substrate 1502. The device layer 1504 may include, for example, one or more source and/or drain (S/D) regions 1520, a gate 1522 to control current flow in the transistors 1540 between the S/D regions 1520, and one or more S/D contacts 1524 to route electrical signals to/from the S/D regions 1520. The transistors 1540 may include additional features not depicted for the sake of clarity, such as device isolation regions, gate contacts, and the like. The transistors 1540 are not limited to the type and configuration depicted in FIG. 15C and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 1540 may include a gate 1522 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 1540 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 1540 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1520 may be formed within the substrate 1502 adjacent to the gate 1522 of each transistor 1540. The S/D regions 1520 may be formed using either an implantation/diffusion process or an etching/deposition process, for example. In the former process, dopants such as boron, aluminum, antimony, phosphorous, or arsenic may be ion-implanted into the substrate 1502 to form the S/D regions 1520. An annealing process that activates the dopants and causes them to diffuse farther into the substrate 1502 may follow the ion-implantation process. In the latter process, the substrate 1502 may first be etched to form recesses at the locations of the S/D regions 1520. An epitaxial deposition process may then be carried out to fill the recesses with material that is used to fabricate the S/D regions 1520. In some implementations, the S/D regions 1520 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1520 may be formed using one or more alternate semiconductor materials such as germanium or a group III-V material or alloy. In further embodiments, one or more layers of metal and/or metal alloys may be used to form the S/D regions 1520.

Electrical signals, such as power and/or input/output (I/O) signals, may be routed to and/or from the transistors 1540 of the device layer 1504 through one or more interconnect layers disposed on the device layer 1504 (illustrated in FIG. 15C as interconnect layers 1506-1510). For example, electrically conductive features of the device layer 1504 (e.g., the gate 1522 and the S/D contacts 1524) may be electrically coupled with the interconnect structures 1528 of the interconnect layers 1506-1510. The one or more interconnect layers 1506-1510 may form an interlayer dielectric (ILD) stack 1519 of the IC device 1500.

The interconnect structures 1528 may be arranged within the interconnect layers 1506-1510 to route electrical signals according to a wide variety of designs (in particular, the arrangement is not limited to the particular configuration of interconnect structures 1528 depicted in FIG. 15C). Although a particular number of interconnect layers 1506-1510 is depicted in FIG. 15C, embodiments of the present disclosure include IC devices having more or fewer interconnect layers than depicted.

In some embodiments, the interconnect structures 1528 may include trench structures 1528*a* (sometimes referred to as "lines") and/or via structures 1528*b* (sometimes referred to as "holes") filled with an electrically conductive material such as a metal. The trench structures 1528*a* may be arranged to route electrical signals in a direction of a plane that is substantially parallel with a surface of the substrate 1502 upon which the device layer 1504 is formed. For example, the trench structures 1528*a* may route electrical signals in a direction in and out of the page from the perspective of FIG. 15C. The via structures 1528*b* may be arranged to route electrical signals in a direction of a plane that is substantially perpendicular to the surface of the substrate 1502 upon which the device layer 1504 is formed. In some embodiments, the via structures 1528*b* may electrically couple trench structures 1528*a* of different interconnect layers 1506-1510 together.

The interconnect layers 1506-1510 may include a dielectric material 1526 disposed between the interconnect structures 1528, as shown in FIG. 15C. In some embodiments, the dielectric material 1526 disposed between the interconnect structures 1528 in different ones of the interconnect layers 1506-1510 may have different compositions; in other embodiments, the composition of the dielectric material 1526 between different interconnect layers 1506-1510 may be the same.

A first interconnect layer 1506 (referred to as Metal 1 or "M1") may be formed directly on the device layer 1504. In some embodiments, the first interconnect layer 1506 may include trench structures 1528*a* and/or via structures 1528*b*, as shown. The trench structures 1528*a* of the first interconnect layer 1506 may be coupled with contacts (e.g., the S/D contacts 1524) of the device layer 1504.

A second interconnect layer 1508 (referred to as Metal 2 or "M2") may be formed directly on the first interconnect layer 1506. In some embodiments, the second interconnect layer 1508 may include via structures 1528*b* to couple the trench structures 1528*a* of the second interconnect layer 1508 with the trench structures 1528*a* of the first interconnect layer 1506. Although the trench structures 1528*a* and the via structures 1528*b* are structurally delineated with a line within each interconnect layer (e.g., within the second interconnect layer 1508) for the sake of clarity, the trench structures 1528*a* and the via structures 1528*b* may be structurally and/or materially contiguous (e.g., simultaneously filled during a dual-damascene process) in some embodiments.

A third interconnect layer 1510 (referred to as Metal 3 or "M3") (and additional interconnect layers, as desired) may be formed in succession on the second interconnect layer 1508 according to similar techniques and configurations described in connection with the second interconnect layer 1508 or the first interconnect layer 1506.

The IC device 1500 may include a solder resist material 1534 (e.g., polyimide or similar material) and one or more bond pads 1536 formed on the interconnect layers 1506-1510. The bond pads 1536 may provide the contacts to couple to first level interconnects, for example. The bond pads 1536 may be electrically coupled with the interconnect structures 1528 and configured to route the electrical signals of the transistor(s) 1540 to other external devices. For example, solder bonds may be formed on the one or more bond pads 1536 to mechanically and/or electrically couple a chip including the IC device 1500 with another component (e.g., a circuit board). The IC device 1500 may have other alternative configurations to route the electrical signals from the interconnect layers 1506-1510 than depicted in other embodiments. For example, the bond pads 1536 may be replaced by or may further include other analogous features (e.g., posts) that route the electrical signals to external components.

FIG. 16 is a cross-sectional side view of an IC device assembly 1600 that may include any of the embodiments of the package substrates disclosed herein. The IC device assembly 1600 includes a number of components disposed on a circuit board 1602. The IC device assembly 1600 may include components disposed on a first face 1640 of the circuit board 1602 and an opposing second face 1642 of the circuit board 1602; generally, components may be disposed on one or both faces 1640 and 1642.

In some embodiments, the circuit board 1602 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1602. In other embodiments, the circuit board 1602 may be a non-PCB substrate.

The IC device assembly 1600 illustrated in FIG. 16 includes a package-on-interposer structure 1636 coupled to the first face 1640 of the circuit board 1602 by coupling components 1616. The coupling components 1616 may electrically and mechanically couple the package-on-interposer structure 1636 to the circuit board 1602, and may include solder balls (as shown in FIG. 16), male and female portions of a socket, an adhesive, an underfill material, and/or any other suitable electrical and/or mechanical coupling structure.

The package-on-interposer structure 1636 may include an IC package 1620 coupled to an interposer 1604 by coupling components 1618. The coupling components 1618 may take any suitable form for the application, such as the forms discussed above with reference to the coupling components 1616. For example, the coupling components 1618 may be second level interconnects. Although a single IC package 1620 is shown in FIG. 16, multiple IC packages may be coupled to the interposer 1604; indeed, additional interposers may be coupled to the interposer 1604. The interposer 1604 may provide an intervening substrate used to bridge the circuit board 1602 and the IC package 1620. The IC package 1620 may be or include, for example, a die (the die 1505 of FIG. 15B), an IC device (e.g., the IC device 1500 of FIG. 15C), or any other suitable component. In particular, the IC package 1620 may take any of the embodiments of the IC package substrates disclosed herein, and may include a package substrate with high density interconnects. Generally, the interposer 1604 may spread a connection to a wider pitch or reroute a connection to a different connection. For example, the interposer 1604 may couple the IC package 1620 (e.g., a die) to a ball grid array (BGA) of the coupling components 1616 for coupling to the circuit board 1602. In the embodiment illustrated in FIG. 16, the IC package 1620 and the circuit board 1602 are attached to opposing sides of the interposer 1604; in other embodiments, the IC package 1620 and the circuit board 1602 may be attached to a same side of the interposer 1604. In some embodiments, three or more components may be interconnected by way of the interposer 1604.

The interposer 1604 may be formed of an epoxy resin, a fiberglass-reinforced epoxy resin, a ceramic material, or a polymer material such as polyimide. In some embodiments, the interposer 1604 may be formed of alternate rigid or flexible materials that may include the same materials used in a semiconductor substrate, such as silicon, germanium, and other group III-V and group IV materials. The interposer 1604 may include metal interconnects 1608 and vias 1610, including but not limited to through-silicon vias (TSVs) 1606. The interposer 1604 may further include embedded devices 1614, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 1604. The package-on-interposer structure 1636 may take the form of any of the package-on-interposer structures known in the art.

The IC device assembly 1600 may include an IC package 1624 coupled to the first face 1640 of the circuit board 1602 by coupling components 1622. The coupling components 1622 may take the form of any of the embodiments discussed above with reference to the coupling components 1616, and the IC package 1624 may take the form of any of the embodiments discussed above with reference to the IC package 1620. In particular, the IC package 1624 may take the form of any of the embodiments of the IC package disclosed herein, and may include a package substrate with high density interconnects.

The IC device assembly 1600 illustrated in FIG. 16 includes a package-on-package structure 1634 coupled to the second face 1642 of the circuit board 1602 by coupling components 1628. The package-on-package structure 1634 may include an IC package 1626 and an IC package 1632 coupled together by coupling components 1630 such that the IC package 1626 is disposed between the circuit board 1602 and the IC package 1632. The coupling components 1628 and 1630 may take the form of any of the embodiments of the coupling components 1616 discussed above, and the IC packages 1626 and 1632 may take the form of any of the embodiments of the IC package 1620 discussed above. In particular, the IC packages 1626 and 1632 may take any of the embodiments of the IC package substrate with high density interconnects disclosed herein.

FIG. 17 is a block diagram of an example computing device 1700 that may include one or more of the package substrates disclosed herein. For example, any suitable ones of the components of the computing device 1700 may include, or be included in, an IC package having a package substrate with high density interconnects, in accordance with any of the embodiments disclosed herein. A number of components are illustrated in FIG. 17 as included in the computing device 1700, but any one or more of these components may be omitted or duplicated, as suitable for the application. In some embodiments, some or all of the components included in the computing device 1700 may be attached to one or more motherboards. In some embodiments, some or all of these components are fabricated onto a single system-on-a-chip (SoC) die.

Additionally, in various embodiments, the computing device 1700 may not include one or more of the components illustrated in FIG. 17, but the computing device 1700 may include interface circuitry for coupling to the one or more components. For example, the computing device 1700 may not include a display device 1706, but may include display device interface circuitry (e.g., a connector and driver circuitry) to which a display device 1706 may be coupled. In another set of examples, the computing device 1700 may not include an audio input device 1724 or an audio output device 1708, but may include audio input or output device interface circuitry (e.g., connectors and supporting circuitry) to which an audio input device 1724 or audio output device 1708 may be coupled.

The computing device 1700 may include a processing device 1702 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1702 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1700 may include a memory 1704, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1704 may include memory that shares a die with the processing device 1702. This memory may be used as cache memory and may include embedded dynamic random access memory (eDRAM) or spin transfer torque magnetic random-access memory (STT-MRAM).

In some embodiments, the computing device 1700 may include a communication chip 1712 (e.g., one or more communication chips). For example, the communication chip 1712 may be configured for managing wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1712 may implement any of a number of wireless standards or protocols, including but not limited to Institute for Electrical and Electronic Engineers (IEEE) standards including Wi-Fi (IEEE 5302.11 family), IEEE 5302.16 standards (e.g., IEEE 5302.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 5302.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 5302.16 standards. The communication chip 1712 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1712 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1712 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1712 may operate in accordance with other wireless protocols in other embodiments. The computing device 1700 may include an antenna 1722 to facilitate wireless communications and/or to receive other wireless communications (such as AM or FM radio transmissions).

In some embodiments, the communication chip 1712 may manage wired communications, such as electrical, optical, or any other suitable communication protocols (e.g., the Ethernet). As noted above, the communication chip 1712 may include multiple communication chips. For instance, a first communication chip 1712 may be dedicated to shorter-range wireless communications such as Wi-Fi or Bluetooth, and a second communication chip 1712 may be dedicated to longer-range wireless communications such as GPS, EDGE, GPRS, CDMA, WiMAX, LTE, EV-DO, or others. In some embodiments, a first communication chip 1712 may be dedicated to wireless communications, and a second communication chip 1712 may be dedicated to wired communications.

The computing device 1700 may include battery/power circuitry 1714. The battery/power circuitry 1714 may include one or more energy storage devices (e.g., batteries or capacitors) and/or circuitry for coupling components of the computing device 1700 to an energy source separate from the computing device 1700 (e.g., AC line power).

The computing device 1700 may include a display device 1706 (or corresponding interface circuitry, as discussed above). The display device 1706 may include any visual indicators, such as a heads-up display, a computer monitor, a projector, a touchscreen display, a liquid crystal display (LCD), a light-emitting diode display, or a flat panel display, for example.

The computing device 1700 may include an audio output device 1708 (or corresponding interface circuitry, as discussed above). The audio output device 1708 may include any device that generates an audible indicator, such as speakers, headsets, or earbuds, for example.

The computing device 1700 may include an audio input device 1724 (or corresponding interface circuitry, as discussed above). The audio input device 1724 may include any device that generates a signal representative of a sound, such as microphones, microphone arrays, or digital instruments (e.g., instruments having a musical instrument digital interface (MIDI) output).

The computing device 1700 may include a global positioning system (GPS) device 1718 (or corresponding interface circuitry, as discussed above). The GPS device 1718 may be in communication with a satellite-based system and may receive a location of the computing device 1700, as known in the art.

The computing device 1700 may include an other output device 1710 (or corresponding interface circuitry, as discussed above). Examples of the other output device 1710 may include an audio codec, a video codec, a printer, a wired or wireless transmitter for providing information to other devices, or an additional storage device.

The computing device 1700 may include an other input device 1720 (or corresponding interface circuitry, as discussed above). Examples of the other input device 1720 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1700 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1700 may be any other electronic device that processes data.

The following examples pertain to further embodiments. The various features of the different embodiments may be variously combined with some features included and others excluded to suit a variety of different applications.

Example 1 is an integrated circuit package substrate, including: a first dielectric layer; a sputter seed layer formed on the first dielectric layer, wherein the seed layer comprises a copper alloy; a patterned conductive layer formed on the seed layer; and a second dielectric layer formed on the first dielectric layer and the patterned conductive layer.

Example 2 may include the subject matter of Example 1, and may further include: a second sputter seed layer formed on the second dielectric layer, wherein the second sputter seed layer comprises a copper alloy.

Example 3 may include the subject matter of any of Examples 1-2, and may further specify that the copper alloy comprises one or more of manganese, cobalt, ruthenium, tungsten, or aluminum.

Example 4 may include the subject matter of any of Examples 1-2, and may further specify that the seed layer thickness is less than 0.5 um.

Example 5 may include the subject matter of any of Examples 1-2, and may further specify that the seed layer thickness is less than 0.3 um.

Example 6 may include the subject matter of any of Examples 1-2, and may further specify that the top surface of the seed layer is roughened during sputtering.

Example 7 may include the subject matter of any of Examples 1-2, and may further specify that the top surface of the seed layer is roughened after sputtering by low ion bombardment.

Example 8 may include the subject matter of Example 1, and may further specify that the line space width is 2/2 um.

Example 9 may include the subject matter of any of Examples 1-2, and may further specify that the seed layer comprises more than one layer.

Example 10 may include the subject matter of Example 9, and may further specify that a first layer of the seed layer comprises copper and a second layer of the seed layer comprises copper alloy.

Example 11 may include the subject matter of Example 9, and may further specify that a first layer of the seed layer comprises a first copper alloy and a second layer of the seed layer comprises a second copper alloy.

Example 12 may include the subject matter of Example 11, and may further specify that the first copper alloy and the second copper alloy are different alloys.

Example 13 may include the subject matter of Example 11, and may further specify that the first copper alloy and the second copper alloy are the same alloy comprising different material percentages.

Example 14 may include the subject matter of Example 1, and may further specify that the thickness of the dielectric layer is approximately the same as the width of a conductive trace.

Example 15 may include the subject matter of Example 1, and may further specify that the sputter seed layer having the copper alloy improves electro-migration resistance as compared to a sputter seed layer without the copper alloy.

Example 16 is a method of forming an integrated circuit package substrate, the method includes: forming a first dielectric layer; sputtering a seed layer over the first dielectric layer, wherein the seed layer comprises a copper alloy; depositing and patterning a first photoresist layer to expose a portion of the seed layer; depositing a conductive material into the exposed portion of the first photo resist layer to form a patterned conductive layer over the seed layer; removing the first photoresist layer; depositing and patterning a second photoresist layer to expose a portion of the patterned conductive layer; depositing a conductive material into the exposed portion of the second photo resist layer to form a conductive via; removing the second photoresist layer; etching portions of the exposed seed layer; forming a second dielectric layer over the patterned conductive layer and the conductive via; and recessing the second dielectric layer to expose a top surface of the conductive via.

Example 17 may include the subject matter of Example 16, and may further include sputtering a second seed layer over the second dielectric layer and the exposed top surface of the conductive via, wherein the second seed layer comprises a copper alloy.

Example 18 may include the subject matter of Example 17, and may further include: depositing a third photoresist layer and patterning the third photoresist layer to expose a portion of the second seed layer; depositing the conductive material into the exposed portion of the third photo resist layer to form a patterned second conductive layer over the second seed layer; removing the third photoresist layer; depositing a fourth photoresist layer and patterning the fourth photoresist layer to expose a portion of the patterned second conductive layer; depositing the conductive material into the exposed portion of the fourth photo resist layer to form a second conductive via; removing the fourth photoresist layer; etching portions of the exposed second seed layer; forming a third dielectric layer over the patterned second conductive layer and the second conductive via; and recessing the second dielectric layer to expose a top surface of the second conductive via.

Example 19 may include the subject matter of any of Examples 16-17, and may further specify that the copper alloy comprises one or more of manganese, cobalt, ruthenium, tungsten, or aluminum.

Example 20 may include the subject matter of any of Examples 16-17, and may further specify that the seed layer thickness is less than 0.5 um.

Example 21 may include the subject matter of any of Examples 16-17, and may further specify that the seed layer thickness is less than 0.3 um.

Example 22 may include the subject matter of any of Examples 16-17, and may further include: roughening the top surface of the seed layer prior to depositing a first photoresist layer.

Example 23 may include the subject matter of Example 22, and may further specify that the top surface of the seed layer is roughened during sputtering.

Example 24 may include the subject matter of Example 22, and may further specify that the top surface of the seed layer is roughened after sputtering by low ion bombardment.

Example 25 may include the subject matter of any of Examples 16-17, and may further specify that the seed layer comprises more than one layer.

Example 26 may include the subject matter of Example 25, and may further specify that a first layer of the seed layer comprises copper and a second layer of the seed layer comprises copper alloy.

Example 27 may include the subject matter of Example 25, and may further specify that a first layer of the seed layer comprises a first copper alloy and a second layer of the seed layer comprises a second copper alloy.

Example 28 may include the subject matter of Example 27, and may further specify that the first copper alloy and the second copper alloy are different alloys.

Example 29 may include the subject matter of Example 27, and may further specify that the first copper alloy and the second copper alloy are the same alloy comprising different material percentages.

Example 30 may include the subject matter of Example 16, and may further specify that the thickness of the dielectric layer is approximately the same as the width of a conductive trace.

Example 31 is a method of forming an integrated circuit package substrate, the method including: forming a first dielectric layer; sputtering a seed layer over the first dielectric layer, wherein the seed layer comprises a copper alloy; depositing and patterning a conductive layer over the seed layer; etching portions of the exposed seed layer; forming a second dielectric layer over the patterned conductive layer; and recessing the second dielectric layer to expose a top surface of the conductive via.

What is claimed is:
1. An integrated circuit (IC) package substrate, comprising:
   a first dielectric layer;
   a seed layer formed on the first dielectric layer, wherein the seed layer comprises a copper alloy, and wherein a top surface of the seed layer is roughened;
   a patterned conductive layer formed on the seed layer; and
   a second dielectric layer formed on the first dielectric layer and the patterned conductive layer.

2. The IC package substrate of claim 1, wherein the copper alloy comprises one or more of manganese, cobalt, ruthenium, tungsten, or aluminum.

3. The IC package substrate of claim 1, wherein a thickness of the seed layer is less than 0.5 um.

4. The IC package substrate of claim 1, wherein the top surface of the seed layer is roughened during formation.

5. The IC package substrate of claim 1, wherein the top surface of the seed layer is roughened after formation by low ion bombardment.

6. The IC package substrate of claim 1, wherein the patterned conductive layer includes a first conductive trace, a second conductive trace, and a space between the first and the second conductive traces, and wherein a line space width of the first conductive trace and the space between the first and the second conductive traces is 2/2 um.

7. The IC package substrate of claim 1, wherein the patterned conductive layer includes a conductive trace, and wherein a thickness of the second dielectric layer is approximately equal to a width of the conductive trace.

8. An integrated circuit (IC) device, comprising:
a package substrate, the package substrate comprising:
a first dielectric layer;
a seed layer formed on the first dielectric layer, wherein the seed layer comprises a copper alloy, and wherein a top surface of the seed layer is roughened;
a patterned conductive layer formed on the seed layer; and
a second dielectric layer formed on the first dielectric layer and the patterned conductive layer; and
a die coupled to the package substrate.

9. The IC device of claim 8, wherein the copper alloy comprises one or more of manganese, cobalt, ruthenium, tungsten, or aluminum.

10. The IC device of claim 8, wherein a thickness of the seed layer is less than 0.5 um.

11. The IC device of claim 8, wherein the seed layer is a first seed layer, the IC device further comprising:
a second seed layer formed on the second dielectric layer, wherein the second seed layer comprises a copper alloy.

12. The IC device of claim 8, wherein the seed layer comprises more than one layer.

13. The IC device of claim 12, wherein a first layer of the seed layer comprises copper and a second layer of the seed layer comprises copper alloy.

14. The IC device of claim 12, wherein a first layer of the seed layer comprises a first copper alloy and a second layer of the seed layer comprises a second copper alloy.

15. The IC device of claim 14, wherein the first copper alloy and the second copper alloy are different alloys.

16. A method of forming an integrated circuit package substrate, the method comprising:
forming a first dielectric layer;
sputtering a seed layer over the first dielectric layer, wherein the seed layer comprises a copper alloy;
depositing and patterning a first photoresist layer to expose a portion of the seed layer;
depositing a first conductive material into the exposed portion of the first photoresist layer to form a patterned conductive layer over the seed layer;
removing the first photoresist layer;
depositing and patterning a second photoresist layer to expose at least a portion of the patterned conductive layer;
depositing a second conductive material into the exposed portion of the second photoresist layer to form a conductive via;
removing the second photoresist layer;
etching portions of the seed layer;
forming a second dielectric layer over the patterned conductive layer and the conductive via; and
recessing the second dielectric layer to expose a top surface of the conductive via.

17. The method of claim 16, wherein the seed layer is a first seed layer, the method further comprising sputtering a second seed layer over the second dielectric layer and the top surface of the conductive via, wherein the second seed layer comprises a copper alloy.

18. The method of claim 17, further comprising:
depositing a third photoresist layer and patterning the third photoresist layer to expose at least a portion of the second seed layer;
depositing a third conductive material into the exposed portion of the third photoresist layer to form a patterned second conductive layer over the second seed layer;
removing the third photoresist layer;
depositing a fourth photoresist layer and patterning the fourth photoresist layer to expose at least a portion of the patterned second conductive layer;
depositing a fourth conductive material into the exposed portion of the fourth photoresist layer to form a second conductive via;
removing the fourth photoresist layer;
etching portions of the second seed layer;
forming a third dielectric layer over the patterned second conductive layer and the second conductive via; and
recessing the second dielectric layer to expose a top surface of the second conductive via.

19. The method of claim 16, wherein the copper alloy comprises one or more of manganese, cobalt, ruthenium, tungsten, or aluminum.

20. The method of claim 16, wherein a thickness of the seed layer is less than 0.5 um.

* * * * *